(12) United States Patent
Klintberg et al.

(10) Patent No.: US 12,365,263 B2
(45) Date of Patent: Jul. 22, 2025

(54) METHOD FOR ESTIMATING OR PREDICTING AN INTERNAL BATTERY STATE OF A BATTERY UNIT

(71) Applicant: VOLVO TRUCK CORPORATION, Gothenburg (SE)

(72) Inventors: Anton Klintberg, Torslanda (SE); Faisal Altaf, Västra Frölunda (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 778 days.

(21) Appl. No.: 17/655,927

(22) Filed: Mar. 22, 2022

(65) Prior Publication Data

US 2022/0305952 A1 Sep. 29, 2022

(30) Foreign Application Priority Data

Mar. 23, 2021 (EP) .................................. 21164358

(51) Int. Cl.
*B60L 58/13* (2019.01)
*B60L 53/10* (2019.01)
(Continued)

(52) U.S. Cl.
CPC .............. *B60L 58/13* (2019.02); *B60L 53/10* (2019.02); *B60L 53/62* (2019.02); *B60L 53/64* (2019.02); *B60L 53/66* (2019.02)

(58) Field of Classification Search
CPC ...................................................... B60L 58/13
(Continued)

(56) References Cited

U.S. PATENT DOCUMENTS

| 6,534,954 B1* | 3/2003 | Plett | H01M 10/48 320/132 |
|---|---|---|---|
| 2008/0054850 A1* | 3/2008 | Tae | B60W 10/26 320/136 |

(Continued)

FOREIGN PATENT DOCUMENTS

| CN | 105607009 B | 5/2018 |
|---|---|---|
| CN | 112433155 A | 3/2021 |
| JP | 2020085569 A | 6/2020 |

OTHER PUBLICATIONS

Tang Xiaopeng et al: "Observer based battery SOC estimation: Using multi-gain-switching approach", Applied Energy., vol. 204, Oct. 1, 2017 (Oct. 1, 2017), pp. 1275-1283, XP055845979, GB ISSN: 0306-2619, DOI: 10.1016/j.apenergy.2017.03.079.

Mohite Set Al: "Impact of temperature on State of Charge estimation for an Electric Vehicle", 2019 North American Power Symposium (NAPS), IEEE, Oct. 13, 2019 (Oct. 13, 2019), pp. 1-6, XP033719484, DOI: 10.1109/NAPS46351.2019.9000303 [retrieved on Feb. 14, 2020].

(Continued)

*Primary Examiner* — Jerry D Robbins
(74) *Attorney, Agent, or Firm* — Venable LLP; Jeffri A. Kaminski

(57) ABSTRACT

A method for estimating or predicting an internal battery state of at least one battery unit within an electric energy storage system, such as in a vehicle. The method includes obtaining operational data of the electric energy storage system relating to operating conditions of the electric energy storage system, feeding the obtained operational data to a non-linear state observer adapted to estimate and/or predict the internal battery state of the at least one battery unit in a series of time steps, such that an observer error of the non-linear state observer converges towards zero, or towards a value close to zero, based on at least the obtained operational data, estimating or predicting the internal battery state using the non-linear state observer.

14 Claims, 2 Drawing Sheets

(51) Int. Cl.
  *B60L 53/62* (2019.01)
  *B60L 53/64* (2019.01)
  *B60L 53/66* (2019.01)

(58) Field of Classification Search
  USPC .......................................................... 324/427
  See application file for complete search history.

(56) References Cited

U.S. PATENT DOCUMENTS

| | | | | |
|---|---|---|---|---|
| 2012/0072145 | A1* | 3/2012 | Zhang | H01M 10/44 |
| | | | | 702/63 |
| 2012/0105069 | A1* | 5/2012 | Wang | G01R 31/392 |
| | | | | 324/427 |
| 2013/0006454 | A1* | 1/2013 | Li | B60L 58/12 |
| | | | | 180/65.265 |
| 2013/0006455 | A1* | 1/2013 | Li | G01R 31/367 |
| | | | | 180/65.265 |
| 2018/0031639 | A1* | 2/2018 | Heiries | G01R 31/389 |

OTHER PUBLICATIONS

European Search Report dated Oct. 18, 2021 in corresponding European Patent Application No. 21164358.0, 6 pages.

Gregory L. Plett, Extended Kalman filtering for battery management systems of LiPB-based HEV battery packs: Part 3. State and parameter estimation, Journal of Power Sources, vol. 134, Issue 2, 2004, pp. 277-292, ISSN 0378-7753, https://doi.org/10.1016/j.jpowsour.2004.02.033.

Gregory L. Plett, Sigma-point Kalman filtering for battery management systems of LiPB-based HEV battery packs: Part 1: Introduction and state estimation, Journal of Power Sources, vol. 161, Issue 2, 2006, pp. 1356-1368, ISSN 0378-7753, https://doi.org/10.1016/j.jpowsour.2006.06.003.

Xiaosong, Hu & Fengchun, Sun & Zou, Yuan. (2010). Estimation of State of Charge of a Lithium-Ion Battery Pack for Electric Vehicles Using an Adaptive Luenberger Observer. Energies. 3. 10.3390/en3091586.

* cited by examiner

METHOD FOR ESTIMATING OR PREDICTING AN INTERNAL BATTERY STATE OF A BATTERY UNIT

TECHNICAL FIELD

The invention relates to a method for estimating or predicting an internal battery state of at least one battery unit within an electric energy storage system, such as in a vehicle.

The invention can be applied to any type of electric vehicles; either hybrid electric vehicles (HEVs), plug-in hybrid electric vehicles (PHEVs), battery electric vehicles (BEVs), or Fuel-Cell Electric Vehicles (FCEVs). Although the invention will be described with respect to an electric bus, the invention is not restricted to this particular vehicle, but may also be used in other hybrid or electric vehicles such as electric trucks, electric construction equipment, and electric passenger cars. The invention may also be applied in any other type of electric vehicle such as electric powered construction equipment, electric working machines e.g., wheel loaders, articulated haulers, dump trucks, excavators and backhoe loaders etc. The invention is further applicable in vessels and in stationary electric energy storage systems.

BACKGROUND

Batteries are becoming a more common source of power for providing propulsion for vehicles. Such batteries are often rechargeable batteries and typically include a number of battery cells that may be connected in series or in parallel forming a complete battery pack for the vehicle.

A key component for completing the transition to battery powered vehicles is a battery with high energy and power density and a long cycle life. However, the performance is not purely determined by the battery itself, but also of systems that are controlling and observing the internal processes in the battery, usually referred to as Battery Management Systems. A key part of those systems is to estimate and/or predict the unmeasurable internal states of the battery, such as the state-of-charge, SoC. SoC estimation has been extensively investigated in the literature and many different type of observers have been proposed. For instance, the Extended Kalman filter (EKF) has been proposed by G. L. Plett, Journal of Power Sources, vol. 134, no. 2, pp. 277-292, 2004, the Unscented Kalman filter has been proposed by G. L. Plett, Journal of Power Sources, vol. 161, pp. 1356-1368, 2006. The use of a Luenberger Observer has been proposed by X. Hu et al., Energies, vol. 3, no. 9, pp. 1586-1603, 2010.

Most of those works are focusing on estimation accuracy rather than computational cost, even though it can in practice be expensive to obtain this accuracy for all cells in a battery pack. Hence, there is a need to provide more computationally efficient methods for predicting or estimating internal battery states.

SUMMARY

A main object of the invention is to provide an in at least some aspect improved method for predicting or estimating an internal battery state of a battery unit, such as in a vehicle. In particular, it is an object to achieve a computationally efficient method to predict or estimate such an internal battery state.

According to a first aspect of the invention, at least the main object is achieved by a method for estimating or predicting an internal battery state of at least one battery unit within an electric energy storage system according to claim 1. The electric energy storage system, herein also referred to as an ESS, may be an electric energy storage system of a vehicle or a vessel, or a stationary electric energy storage system.

The method comprises:
  obtaining operational data of the electric energy storage system relating to operating conditions of the electric energy storage system,
  feeding the obtained operational data to a non-linear state observer adapted to estimate and/or predict the internal battery state of the at least one battery unit in a series of time steps, such that an observer error of the non-linear state observer converges towards zero, or towards a value close to zero,
  based on at least the obtained operational data, estimating or predicting the internal battery state using the non-linear state observer.

The non-linear state observer is a switched multi-gain observer switching between at least two different static observer gains, wherein the observer gain to be used is selected based on a predicted or estimated value of the internal battery state as determined by the nonlinear state observer.

The proposed method may preferably be used for estimating or predicting the internal battery state of a plurality of battery units within the ESS, such as of a plurality of battery cells of the ESS. The method may e.g. be used for estimating or predicting the internal battery state of all battery cells of the ESS, or of all battery cells of a battery pack or battery module of the ESS. Predicting internal battery states of individual battery cells may be very computationally demanding due to the large number of battery cells usually comprised within an ESS, and the proposed method offers a way of significantly reducing the computational burden. By using a switched multi-gain observer switching between at least two different static observer gains, the observer gains do not need to be calculated during operation of the battery unit(s) but may be determined beforehand. This significantly reduces the computational burden of the method, while the accuracy can remain comparable to already existing methods for estimating or predicting internal battery states. Which one of the previously determined at least two observer gains to use in the estimation or prediction of the internal battery state, may be determined during operation of the battery unit. By switching between at least two different static observer gains, the method may furthermore be made globally stable, i.e. trusted to provide a reliable estimate or prediction over the entire range of possible internal battery state values.

Obtaining operational data may comprise collecting measurement data relating to operating conditions of the ESS, i.e. to measure temperature, current and voltage of the battery unit or battery units of the ESS. This may be carried out using sensors. The obtained operational data may further include derived data, such as derived parameters of the battery unit(s).

Optionally, obtaining operational data of the electric energy storage system further comprises pre-filtering of the collected measurement data to remove high-frequency noise. This makes the estimation or prediction more reliable and may reduce some processing load on the observer. The operational data used as input to the non-linear state observer is thus filtered measurement data.

The observer error of the non-linear state observer should converge towards zero, or towards a value close to zero, which is to be understood as a value within a predefined acceptable margin of error to zero.

Optionally, the method further comprises:
pre-calculating the at least two static observer gains offline,
wherein the internal battery state is estimated or predicted online using the non-linear state observer.

By pre-calculating the observer gains offline, the amount of calculations needed to be performed online during operation are significantly reduced. By "online" is intended during operation of the at least one battery unit, i.e. in real-time as operational data are being obtained, and by "offline" is intended at a point in time different from, and independent of, a point in time at which the gain is used in the estimation or prediction using the non-linear state observer. Thus, the offline calculations may be performed well in advance of the online calculations.

Optionally, the at least two static observer gains are pre-calculated offline based on a description of an open circuit voltage of the at least one battery unit as a function of the internal battery state. The OCV curve, i.e. the open circuit voltage, OCV, as a function of the internal battery state, in particular of the state-of-charge, SoC, may relatively accurately be described as a piecewise linear function having only a few linear sections, such as two or three linear sections. This property of the OCV curve is herein exploited to determine the observer gains. For each approximately linear section of the OCV curve, a specific observer gain may be used. This enables pre-calculation of the observer gains offline, since the OCV curve for a particular battery unit is a characteristic of the battery unit that may be measured beforehand.

Optionally, the observer gain to be used is set to a first observer gain if the estimated or predicted value of the battery state is below a predetermined threshold, and to a second observer gain if the estimated or predicted value of the battery state is above the predetermined threshold. Instead of a single threshold value, multiple thresholds may be used, such as a first and a second predetermined threshold value. Thresholding is a computationally efficient way of determining which observer gain to use.

Optionally, the method further comprises:
based on the obtained operational data relating to a terminal voltage of the at least one battery unit, determining an initial estimate of the internal battery state, wherein the initial estimate is used as an initial value in the estimation or prediction of the internal battery state using the non-linear state observer.

To provide a suitable initial value for the estimation or prediction, the measured terminal voltage can be considered as the open circuit voltage, OCV. In turn, this OCV value can be used to determine an initial battery state estimate, such as an initial state-of-charge, SoC, estimate, which may be used in the estimation or prediction using the non-linear observer.

Optionally, in each time step, the non-linear observer predicts a value of the internal battery state, wherein the selected observer gain is used for correcting the predicted value. Alternatively, the observer gain to be used may be selected based on an estimate of the internal battery state as estimated by the non-linear state observer in a preceding time step.

Optionally, the multi-gain observer is a bimodal observer configured to switch between two static observer gains. Using two different static observer gains, i.e. a bimodal observer, is usually sufficient to account for the most common scenarios and obtain a globally stable method. In the most common scenarios, when the internal battery state is the SoC, the battery unit OCV may typically increase relatively fast with increasing battery unit SoC in a low SoC region and increase more slowly with increasing battery unit SoC in a high SoC region.

Optionally, the internal battery state is a state-of-charge, SoC, of the at least one battery unit. The method may however also be used for predicting e.g. voltage polarization of the at least one battery unit.

Optionally, the non-linear state observer is configured to use a battery model for determining the internal battery state, in which battery model an open circuit voltage of the at least one battery unit is a non-linear function of the state of charge of the at least one battery unit. Such a model is sometimes referred to as a grey box-model. For example, the model may be an equivalent circuit model with one or more resistor-capacitor circuits, commonly referred to as RC-circuits.

The invention also relates to a computer program comprising program code means for performing the method according to the first aspect of the invention when said computer program is run on a computer, and to a computer readable medium carrying a computer program comprising program means for performing the method according to the first aspect of the invention when said program means is run on a computer. It further relates to a control unit configured to perform the method according to the first aspect.

According to another aspect of the invention, a battery management system for an electric energy storage system comprising the control unit configured to perform the method according to the first aspect is provided.

According to yet another aspect of the invention, a vehicle, such as a hybrid vehicle or a fully electrified vehicle, comprising an electric energy storage system and a control unit configured to perform the method according to the first aspect, or a battery management system comprising such a control unit, is provided.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

The drawings are schematic and not necessarily drawn to scale.

DETAILED DESCRIPTION OF EXAMPLE EMBODIMENTS OF THE INVENTION

In the present detailed description, embodiments of the method according to the present invention are mainly described with reference to an all-electric bus, comprising a propulsion system in the form of battery powered electric motors. However, it should be noted that various embodiments of the described invention are equally applicable for a wide range of hybrid and electric vehicles as well as for stationary applications.

Figure 1:
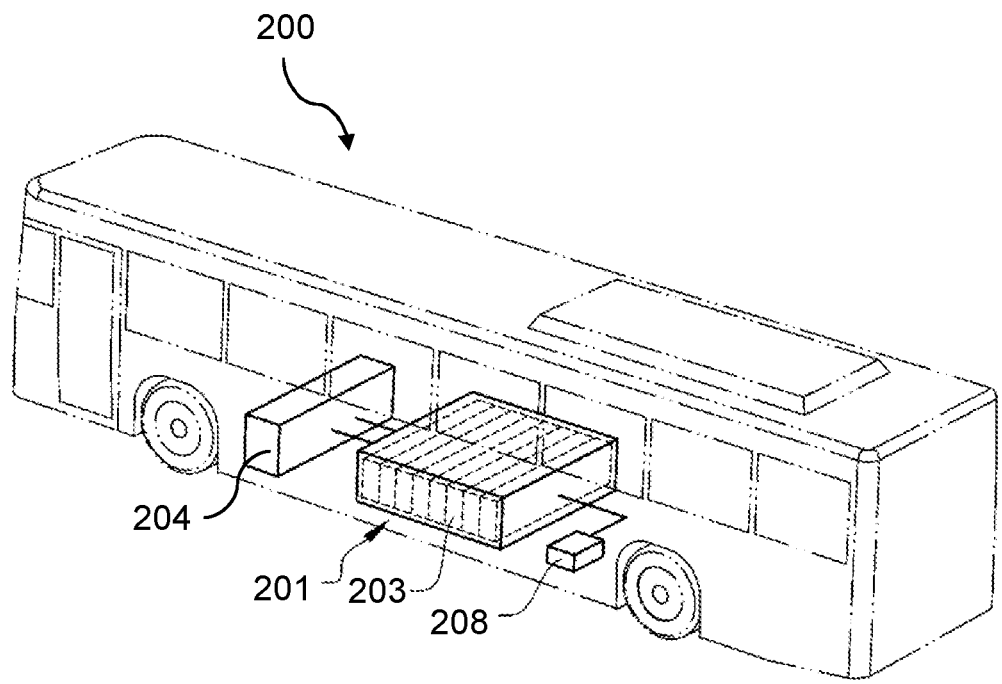
FIG. 1 shows a vehicle in which a method according to the invention may be implemented, FIG. 2 schematically illustrates parts of a battery model describing a battery unit.

FIG. 1 shows a simplified perspective view of an all-electric vehicle in the form of a bus 200, which according to an embodiment is equipped with an electric propulsion unit 204 for propulsion of the bus. Of course, other loads may be provided in addition to or instead of the electric propulsion unit 204, for example auxiliary systems requiring electric power, and/or an on-board charger, and/or a power take-off.

The bus 200 carries an electric energy storage system (ESS) 201 comprising a battery pack with a plurality of battery units 203. The ESS 201 is herein illustrated with a single battery pack, but it is to be noted that it may comprise two or more battery packs, each battery pack comprising a plurality of battery cells. The battery units 203 may e.g. be in the form of battery cells. Some or all of the battery cells 203 within the battery pack may be connected in series to provide an output DC voltage having a desired voltage level. It is possible to arrange the battery cells as a plurality of cell strings, each cell string forming a battery module. The battery modules of the battery pack may in turn be parallel connected. Suitably, the battery cells 203 are of lithium-ion type, but other types may also be used. The number of battery cells 203 per battery pack may be in the range of 50 to 500 cells, or up to many thousands of cells in the case of small format cells. The battery packs of the ESS 201 may be connected in parallel or in series.

Sensor units (not shown) may be arranged for collecting measurement data relating to operating conditions of the ESS 201, for example by measuring temperature, voltage and current level of the battery cells 203. Measurement data from each sensor unit is transmitted to an associated ESS control unit 208, which is configured for managing the ESS 201 during operation of the bus 200. A single control unit 208 is shown, which may be e.g., a so-called Domain Control Unit, DCU, configured to implement complete control functionality on all levels of the ESS 201. In particular when the ESS 201 comprises more than one battery packs, separate battery management units may however be provided for individual battery pack management. As used herein, the term ESS control unit may also be understood as encompassing such individual battery management units. Thus, the method as described herein may be performed either in a battery management unit of an individual battery pack, or in an ESS control unit handling data from, and operation of, several battery packs.

The ESS control unit 208 may include a microprocessor, a microcontroller, a programmable digital signal processor or another programmable device. Thus, the ESS control unit 208 comprises electronic circuits and connections (not shown) as well as processing circuitry (not shown) such that the ESS control unit 208 can communicate with different parts of the bus 200 or with different control units of the bus 200. The ESS control unit 208 may comprise modules in either hardware or software, or partially in hardware or software, and communicate using known transmission buses such a CAN-bus and/or wireless communication capabilities. The processing circuitry may be a general-purpose processor or a specific processor. The ESS control unit 208 comprises a non-transitory memory for storing computer program code and data. Thus, the skilled person realizes that the ESS control unit 208 may be embodied by many different constructions. This is also applicable to other control units of the ESS 201.

Figure 2:
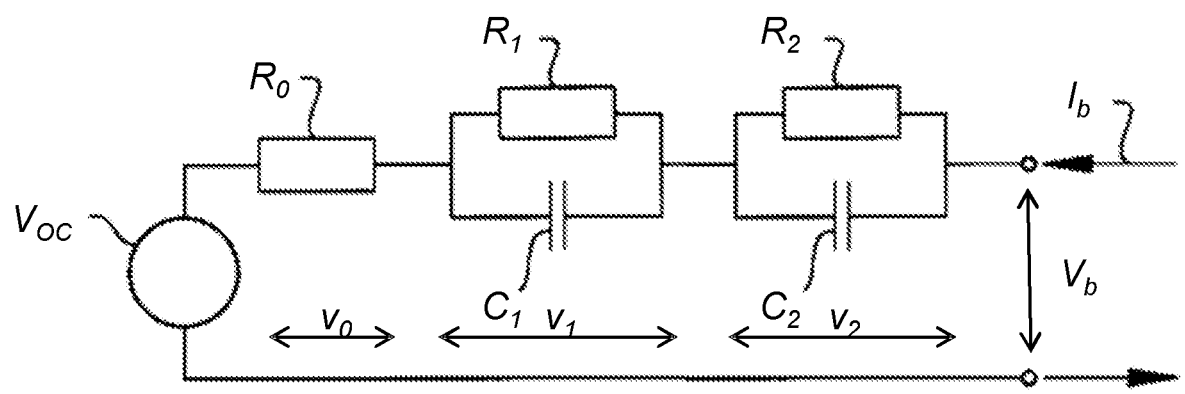

Turning now to FIG. 2, there is depicted a battery model comprising an equivalent circuit of the battery unit 203, also known as a Thevenin battery model. The exemplary equivalent circuit model comprises two RC circuits to model the battery unit 203, although a different number of RC circuits may be used in the model, such as one RC circuit or three RC circuits, depending on battery dynamics and application. The exemplary equivalent circuit model may be used in estimation of internal battery states of the battery unit 203 and is typically implemented by the above mentioned ESS control unit 208. The exemplified equivalent circuit model illustrated in FIG. 2 may be used for estimating the open circuit voltage of the battery unit 203 based on direct battery measurements. The battery unit open circuit voltage estimation may for example be based on measured battery current inputs $I_b$ and a battery terminal voltage $V_b$.

The equivalent circuit model described in relation to FIG. 2 consists of an active electrolyte resistance and conductive resistance of electrodes (or internal ohmic resistance) $R_0$, connected in series with two RC branches. A first RC branch and a second RC branch comprise, respectively, capacitances $c_1$, $c_2$ and active charge transfer resistances $R_1$, $R_2$ connected in parallel. $V_b$ refers to terminal voltage output, $I_b$ refers to the current in the circuit and $V_{OC}$ refers to the battery open circuit voltage. For given values of the terms $V_{OC}$, $R_0$, $R_1$, $R_2$, $c_1$ and $c_2$, the terminal voltage $V_b$ can be expressed as a function of the current $I_b$. Voltages across the internal ohmic resistance $R_0$ and the first and second RC branches, respectively, are expressed as $v_0$, $v_1$ and $v_2$, wherein $v_1$ and $v_2$ are also referred to as voltage polarizations. Normally $R_0$, $R_1$ and $R_2$ increase with age, while battery cell capacity Q (not illustrated in the figure) decreases with age.

The zero-order hold discrete time state space model of the equivalent circuit in FIG. 2 is:

$$\begin{bmatrix} v_1(k+1) \\ v_2(k+1) \\ z(k+1) \end{bmatrix} = \begin{bmatrix} e^{-\frac{\Delta t}{T_1}} & 0 & 0 \\ 0 & e^{-\frac{\Delta t}{T_2}} & 0 \\ 0 & 0 & 1 \end{bmatrix} \begin{bmatrix} v_1(k) \\ v_2(k) \\ z(k) \end{bmatrix} + \begin{bmatrix} R_1\left(1 - e^{-\frac{\Delta t}{T_1}}\right) \\ R_2\left(1 - e^{-\frac{\Delta t}{T_2}}\right) \\ \frac{\eta_i \Delta t}{Q} \end{bmatrix} u(k); \quad (1a)$$

$$y(k) = v_{ocv}(z(k)) + v_1(k) + v_2(k) + R_0 u(k), \quad (1b)$$

where z is the state-of-charge (SoC), $\tau_1 = R_1 c_1$ and $\tau_2 = R_2 c_2$ are time constants of the circuit, $\Delta t$ is the sampling time, $\eta_i$ is the Coulombic efficiency, and $v_{ocv}$ is the OCV-curve. The applied current u(k) is defined to be positive for charging and negative for discharging.

For notational simplicity, the following notation for the state space model is introduced:

$$x(k+1) = Ax(k) + Bu(k) \quad (2a)$$

$$y(k) = h(x(k)) + Du(k) \quad (2b)$$

where $x = [v_1, v_2, z]^T$. $A \in \mathbb{R}^{3 \times 3}$, $B \in \mathbb{R}^3$, $h: \mathbb{R}^3 \to \mathbb{R}$, and $D \in \mathbb{R}$ correspond to their counterparts in the state space model defined in equations (1a, 1b) above.

Figure 3:
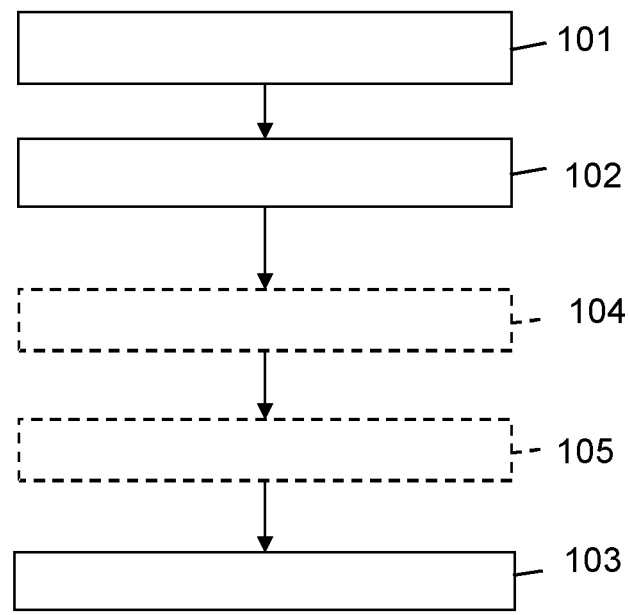
FIG. 3 is a flow-chart illustrating a method according to an embodiment of the invention.

FIG. 3 is a flow-chart illustrating a method for determining an internal battery state of at least one battery unit 203 according to an embodiment of the invention. In short, the method comprises:

the step 101 of obtaining operational data of the ESS 201 relating to operating conditions of the ESS 201;

the step 102 of feeding the obtained operational data to a non-linear state observer adapted to estimate and/or predict the internal battery state of the at least one battery unit in a series of time steps, such that an observer error of the non-linear state observer converges towards zero, or towards a value close to zero; and the step 103 of, based on at least the obtained operational data, estimating or predicting the internal battery state using the non-linear state observer.

The steps 101-103 will be described in further detail in the following. For illustrational purposes, the internal battery state will be exemplified by the state-of-charge, SoC, of a single battery unit 203, although the invention is not limited to the determination of SoC but is also applicable to other internal battery states. Furthermore, the invention is not limited to the determination of the internal battery state of a single battery unit 203 but may be used for simultaneous determination of the internal battery state of a plurality of battery units 203. Furthermore, for illustrational purposes, the battery cell 203 may be modelled using an equivalent circuit model with two resistor-capacitor circuits such as the one shown in FIG. 2.

Step 101: Operational data of the ESS 201 relating to operating conditions of the ESS 201 are obtained by means of the sensor units as discussed above. The operational data may include measurement data relating to current, voltage and temperature of each individual battery unit 203.

Step 102: The obtained operational data are fed to a non-linear state observer adapted to estimate and/or predict the SoC of the battery unit 203 in a series of time steps, such that an observer error of the non-linear state observer converges towards zero, or towards a value close to zero. The non-linear state observer used herein is a switched multi-gain observer switching between at least two different static observer gains $K_1$, $K_2$. Which observer gain to be used is selected based on a predicted or estimated value of the SoC of the battery unit 203 as determined by the nonlinear state observer.

The multi-gain observer may be a bimodal observer configured to switch between two static observer gains $K_1$ and $K_2$, i.e. a so-called bimodal Luenberger observer:

$$\hat{x}(k+1) = \begin{cases} A\hat{x}(k) + Bu(k) + K_1(y(k) - \hat{y}(k)), & \hat{z}(k) \leq \bar{z} \\ A\hat{x}(k) + Bu(k) + K_2(y(k) - \hat{y}(k)), & \hat{z}(k) > \bar{z} \end{cases} \quad (3a)$$

$$\hat{y}(k) = h(\hat{x}(k)) + Du(k), \quad (3b)$$

The objective could for example be to determine $K_1 \in \mathbb{R}^3$, $K_2 \in \mathbb{R}^3$, and $\bar{z} \in \mathbb{R}$ such that the estimation error $e(k) = \hat{x}(k) - x(k)$ converges exponentially and asymptotically to zero. It is noted that the SoC to be estimated or predicted, herein expressed as z, forms part of the vector $x = [v_1, v_2, z]^T$.

The observer gain may be set to a first observer gain $K_1$ if the estimated or predicted value of the SoC is below or equal to a predetermined threshold, i.e. $\hat{z}(k) \leq \bar{z}$, and to a second observer gain $K_2$ if the estimated or predicted value of the battery state is above the predetermined threshold, i.e. $\hat{z}(k) > \bar{z}$.

Step 103: The SoC of the battery unit 203 is predicted or estimated using the non-linear state observer based on, at least, the obtained operational data of the battery unit 203. The step 103 of predicting or estimating the SoC is determined online during operation of the ESS 201. For this purpose, the only equations that need to be calculated online are the equations corresponding to (3a)-(3b) listed above. The number of computations needed to be performed online are thereby significantly reduced in comparison to e.g. methods using an Extended Kalman Filter, EKF, for SoC estimation.

Figure 4:
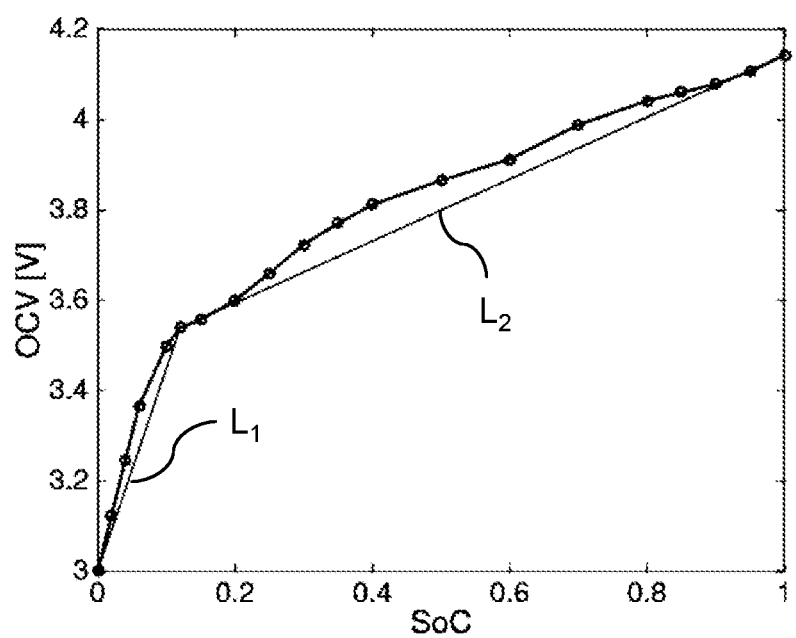
FIG. 4 is a diagram showing an OCV curve of a battery unit.

The static observer gains $K_1$, $K_2$ may be pre-calculated offline in a step 104. This may be carried out in different ways, but it may typically be performed based on the OCV curve of the battery unit 203, i.e. the curve describing the open circuit voltage $V_{OC}$ as a function of SoC. This curve may be experimentally defined beforehand. An example of an OCV curve for a battery cell is shown in FIG. 4, wherein the circles represent experimentally determined values. As can be seen from FIG. 4, the OCV curve can relatively accurately be described as a piecewise linear function, comprising a first section for $SoC \leq 0.12$ that can be approximated as a first line $L_1$ having a relatively large slope of 4.7, and a second section for $SoC > 0.12$ that can be approximated as a second line $L_2$ having a relatively small slope 0.7. The static observer gains $K_1$, $K_2$ are in the example calculated using the slopes of the lines $L_1$ and $L_2$. This may for example be carried out offline by trial and error, during which a number of different observer gains are tested to find the observer gains $K_1$, $K_2$ that result in a convergence of the estimated SoC value to the experimentally determined "true" SoC value. The thus determined observer gains $K_1$, $K_2$ are subsequently used in the online estimations carried out in step 103. In each time step, the non-linear observer may predict a value of the SoC, and the observer gain $K_1$ or $K_2$ is selected based on the predicted SoC value and used for correcting the predicted SoC value. In the present example, the gain $K_1$ is selected if the predicted SoC value is $\leq 0.12$, and the gain $K_2$ is selected if $SoC > 0.12$. Alternatively, the observer gain to be used may be selected based on the SoC estimate as estimated by the non-linear state observer in a preceding time step.

As an initial value for the estimation of the battery unit SoC, an initial estimate of the battery unit SoC may be determined in a step 105. The initial SoC estimate is used as an initial value in the estimation or prediction of SoC using the non-linear state observer. To provide a suitable initial value for the estimation, the measured terminal voltage $V_b$ can be considered as an estimate of the open circuit voltage (OCV). In turn, this gives an initial SoC estimate using the OCV curve, which initial estimate can be input as an initial value to the non-linear state observer.

It is to be understood that the present invention is not limited to the embodiments described above and illustrated in the drawings; rather, the skilled person will recognize that many changes and modifications may be made within the scope of the appended claims.

The invention claimed is:

1. A method for estimating or predicting an internal battery state of at least one battery unit within an electric energy storage system, the method comprising:
   obtaining operational data of the electric energy storage system relating to operating conditions of the electric energy storage system,
   feeding the obtained operational data to a non-linear state observer adapted to estimate and/or predict the internal battery state of the at least one battery unit in a series of time steps, such that an observer error of the non-linear state observer converges towards zero, or towards a value close to zero,
   based on at least the obtained operational data, estimating or predicting the internal battery state using the non-linear state observer, wherein
the non-linear state observer is a switched multi-gain observer switching between at least two different static observer gains, wherein the observer gain to be used is selected based on a predicted or estimated value of the internal battery state as determined by the nonlinear state observer.

2. The method according to claim 1, further comprising:
pre-calculating the at least two static observer gains offline,
wherein the internal battery state is estimated or predicted online using the non-linear state observer.

3. The method according to claim 1, wherein the at least two static observer gains are pre-calculated offline based on a description of an open circuit voltage of the at least one battery unit as a function of the internal battery state.

4. The method according to claim 1, wherein the observer gain to be used is set to a first observer gain if the estimated or predicted value of the battery state is below a predetermined threshold, and to a second observer gain if the estimated or predicted value of the battery state is above the predetermined threshold.

5. The method according to claim 1, further comprising:
based on the obtained operational data relating to a terminal voltage of the at least one battery unit, determining an initial estimate of the internal battery state, wherein the initial estimate is used as an initial value in the estimation or prediction of the internal battery state using the non-linear state observer.

6. The method according to claim 1, wherein, in each time step, the non-linear observer predicts a value of the battery state, wherein the selected observer gain is used for correcting the predicted value.

7. The method according to claim 1, wherein the multi-gain observer is a bimodal observer configured to switch between two static observer gains.

8. The method according to claim 1, wherein the internal battery state is a state-of-charge, SoC, of the at least one battery unit.

9. The method according to claim 1, wherein the non-linear state observer is configured to use a battery model for determining the internal battery state, in which battery model an open circuit voltage of the at least one battery unit is a non-linear function of the state-of-charge of the at least one battery unit.

10. A computer program comprising program code means for performing the method according to claim 1 when said computer program is run on a computer.

11. A computer readable medium carrying a computer program comprising program means for performing the method according to claim 1 when said program means is run on a computer.

12. A control unit configured to perform the method according to claim 1.

13. A battery management system for an electric energy storage system comprising the control unit according to claim 12.

14. A vehicle, such as a hybrid vehicle or a fully electrified vehicle, comprising an electric energy storage system and a control unit according to claim 12.

* * * * *